United States Patent
Simpson et al.

(10) Patent No.: US 12,506,044 B2
(45) Date of Patent: Dec. 23, 2025

(54) SEMICONDUCTOR DEVICE

(71) Applicants: DYNEX SEMICONDUCTOR LIMITED, Lincoln (GB); ZHUZHOU CRRC TIMES SEMICONDUCTOR CO. LTD, Zhuzhou (CN)

(72) Inventors: Robin Adam Simpson, Lincoln (GB); Yangang Wang, Lincoln (GB)

(73) Assignees: DYNEX SEMICONDUCTOR LIMITED, Lincoln (GB); ZHUZHOU CRRC TIMES SEMICONDUCTOR CO. LTD, Zhuzhou (CN)

(*) Notice: Subject to any disclaimer, the term of this patent is extended or adjusted under 35 U.S.C. 154(b) by 487 days.

(21) Appl. No.: 17/928,492

(22) PCT Filed: Jul. 19, 2021

(86) PCT No.: PCT/EP2021/070112
§ 371 (c)(1),
(2) Date: Nov. 29, 2022

(87) PCT Pub. No.: WO2023/001355
PCT Pub. Date: Jan. 26, 2023

(65) Prior Publication Data
US 2024/0258189 A1    Aug. 1, 2024

(51) Int. Cl.
*H01L 23/36* (2006.01)
*H01L 23/367* (2006.01)
*H01L 23/00* (2006.01)

(52) U.S. Cl.
CPC .......... *H01L 23/3675* (2013.01); *H01L 24/16* (2013.01); *H01L 24/32* (2013.01);
(Continued)

(58) Field of Classification Search
None
See application file for complete search history.

(56) References Cited

U.S. PATENT DOCUMENTS

| 2016/0027710 A1 | 1/2016 | Xu et al. |
| 2018/0040538 A1* | 2/2018 | Schuderer .......... H10D 62/8325 |

(Continued)

FOREIGN PATENT DOCUMENTS

| CN | 112992866 A * | 6/2021 | ............ H01L 23/58 |
| EP | 1393373 A1 | 3/2004 | |

(Continued)

OTHER PUBLICATIONS

International Search Report and Written Opinion issued in connection with corresponding PCT Patent Application No. PCT/EP2021/070112 mailed Apr. 13, 2022.

*Primary Examiner* — Krystal Robinson
(74) *Attorney, Agent, or Firm* — Tarolli, Sundheim, Covell & Tummino LLP (57) ABSTRACT

A semiconductor device is provided and includes a housing having first and second opposing housing electrodes and semiconductor units within the housing and coupled to the housing electrodes by pressure. The first housing electrode includes an electrode plate. A thermal coupler is provided between the semiconductor units and the electrode plate. A first array of pillars extend between the semiconductor units and the thermal coupler. A second array of pillars extend between the thermal coupler and the electrode plate. The semiconductor units are electrically coupled to the electrode plate via the first and second arrays of pillars. The thermal coupler extends between at least some of the first array of pillars so as to thermally couple the at least some of the first array of pillars to one another.

18 Claims, 3 Drawing Sheets

(52) U.S. Cl.
CPC .... *H01L 24/73* (2013.01); *H01L 2224/16225* (2013.01); *H01L 2224/32245* (2013.01); *H01L 2224/73203* (2013.01)

(56) References Cited

U.S. PATENT DOCUMENTS

2021/0359451 A1* 11/2021 Park .................. H01R 13/42
2022/0005783 A1* 1/2022 Okada ................ H01L 24/72

FOREIGN PATENT DOCUMENTS

| WO | 2017220949 A1 | 12/2017 |
| WO | 2020152797 A | 7/2020 |
| WO | 2020245950 A | 12/2020 |

\* cited by examiner

S1
Providing a housing which comprises a first housing electrode and a second housing electrode arranged at opposite sides of the housing, wherein the first housing electrode comprises an electrode plate S2
Arranging a plurality of semiconductor units within the housing between the first and second housing electrodes S3
Arranging a thermal coupler within the housing between the plurality of semiconductor units and the electrode plate of the first housing electrode S4
Providing a first array of pillars which extend between the plurality of semiconductor units and the thermal coupler and are electrically coupled to the plurality of semiconductor units, respectively S5
Providing a second array of pillars which extend between the thermal coupler and the electrode plate of the first housing electrode, wherein the first array of pillars are electrically coupled to the electrode plate via the second arrays of pillars S6
Coupling at least one of the first and second housing electrodes to the plurality of semiconductor units by pressure, wherein the thermal coupler is configured to extend between at least some of the first array of pillars so as to thermally couple the at least some of the first array of pillars to one another

Figure 7

SEMICONDUCTOR DEVICE

RELATED APPLICATIONS

The present invention is a U.S. National Stage under 35 USC 371 patent application, claiming priority to PCT Application No. PCT/EP2021/070112, filed on Jul. 19, 2021; the entirety of which is hereby incorporated herein by reference.

TECHNICAL FIELD

The present disclosure relates to a semiconductor device. More particularly, but not exclusively, the present disclosure relates to a pressure-contact power semiconductor device which mitigates the temperature imbalance across all chips within the device while maintaining the uniform distribution of contact pressures across the chips.

BACKGROUND

A power semiconductor device may house one or more power semiconductor chips (or dies). The power semiconductor chips are often used to switch high currents and voltages, and may include one or more of a power transistor, a power diode, and a thyristor, etc. A power transistor includes, but is not limited to, a power metal-oxide-semiconductor field effect transistor (MOSFET), a power bipolar junction transistor (BJT), and an insulated gate bipolar transistor (IGBT), etc. A thyristor includes, but is not limited to, an integrated gate-commutated thyristor (IGCT), and a gate turn-off thyristor (GTO), etc. The power semiconductor device may also be referred to as a power module or a power electronic module.

Figure 1:
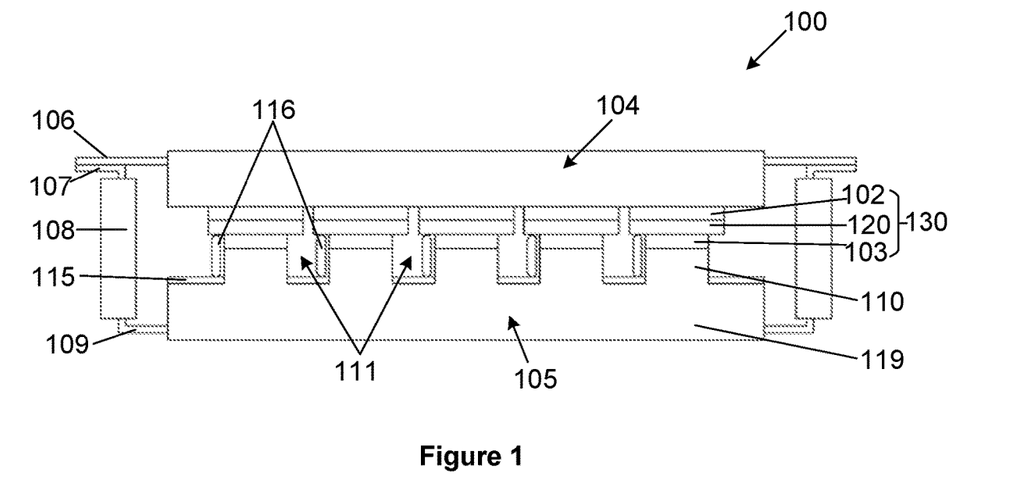
FIG. 1 schematically illustrates a sectional view of a prior semiconductor device.

FIG. 1 schematically illustrates a sectional view of a known power semiconductor device 100 which has a press-pack package. Press-pack power semiconductor devices are an alternative to traditional isolated-base power semiconductor devices, in which power semiconductor chips are typically soldered on isolated substrates that carry the chips respectively and are also wire-bonded to the substrates. Instead of the wire bonds and solder joints used in isolated-base devices, press-pack devices typically rely on the application of force by an external clamping system, to make contact to the chips. In this sense, the power semiconductor device 100 may also be referred to as a pressure-contact power semiconductor device.

As shown in FIG. 1, the press-pack power semiconductor device 100 comprises a plurality of semiconductor chips 120. Individual semiconductor chips 120 are connected in parallel within a single pressure contact housing to produce a single device containing multiple chips with a current handling capability that is ideally the sum of the capability of all the chips contained within the housing. The semiconductor chips 120 are placed between mechanical strain buffers 102, 103 to form semiconductor units 130. These semiconductor units 130 are then positioned between upper and lower electrodes 104, 105 in a hermetically-sealed housing which is formed by the electrodes 104, 105, a ceramic tube 108 and thin flanges 106, 107, 109. The thin flanges include a lid flange 106, a housing upper flange 107, and a housing lower flange 109. The thin flanges 106, 107, 109 make a gas-tight, flexible joint between the electrodes 104, 105 and the ceramic tube 108. The upper and lower electrodes 104, 105 may also be referred to as housing electrodes. The hermetically-sealed housing encloses an internal space 111. The internal space 111 is commonly filled with nitrogen.

It is typical that one electrode (e.g., the upper electrode 104) is a flat electrode plate and the other (e.g., the lower electrode 105) has an electrode plate 119 and an array of pillars 110 formed on the inner surface of the electrode plate 119. The semiconductor units 130 typically have upper and lower contact regions of differing areas. As shown in FIG. 1, the pillars 110 of the lower electrode 105 permit contact to the smaller areas at the bottom surfaces of the semiconductor units 130. The power semiconductor device 100 further has a circuit board 115 placed on the inner surface of the electrode plate 119. Electrical connectors 116 are used to electrically connect the circuit(s) on the circuit board 115 to electrode pads of the chips 120.

In operation, the semiconductor chips 120 are electrically and thermally connected between the upper and lower electrodes 104, 105 by pressure. One or both of the interface between the semiconductor units 130 and the upper electrode 104, and the interface between the semiconductor units 130 and the lower electrode 105 are dry interfaces. A dry interface means that elements at opposite sides of the interface are coupled by pressure, and there is no bonding material between the elements.

For optimum current handling capability and product reliability, the contact pressures between the chips 120 and the housing electrode(s) 104, 105 should be as uniform as possible. This is however difficult to achieve, as micron-level differences in the thicknesses of the semiconductor units 130 and/or surface flatness variations across the housing electrodes 104, 105 can lead to applied pressures that differ greatly between the chips 120 and also differ from the intended target pressure. Further, the flatness of assembly components, such as heatsinks, used in the end-users' applications and whether such components are parallel to the housing electrode(s) 104, 105 would also have significant effects on the pressure non-uniformity across the chips 120. In addition, self-heating effects in the device 100 may result in thermal warpage of the electrodes 104, 105, causing further pressure imbalance across the chips 120. The pressure imbalance across the chips 120 in turn leads to differences in electrical and thermal contact resistances between the chips 120 and the housing electrodes 104, 105. It has been found that premature failures of the device 100 result from a mixture of over-pressurisation and under-pressurisation of certain chips 120 in the device 100.

Further, differences in chip temperatures within the device 100 also limit the performance and reliability of the device 100. There are multiple factors leading to differences in chip temperatures, such as variations in chip parameters, electromagnetic effects (e.g., skin effect), non-uniform thermal contact resistances, non-uniform cooling by heat sinks, etc. The non-uniform thermal contact resistances may be caused by the pressure imbalance across the chips 120 as described above. For press-pack IGBTs (i.e., the chips 120 are IGBTs), chip temperature differences have been found both by simulation and by experimental methods.

Therefore, it is generally desirable to mitigate the effects of the factors causing the pressure imbalance and/or temperature imbalance across the chips 120.

Figure 2:
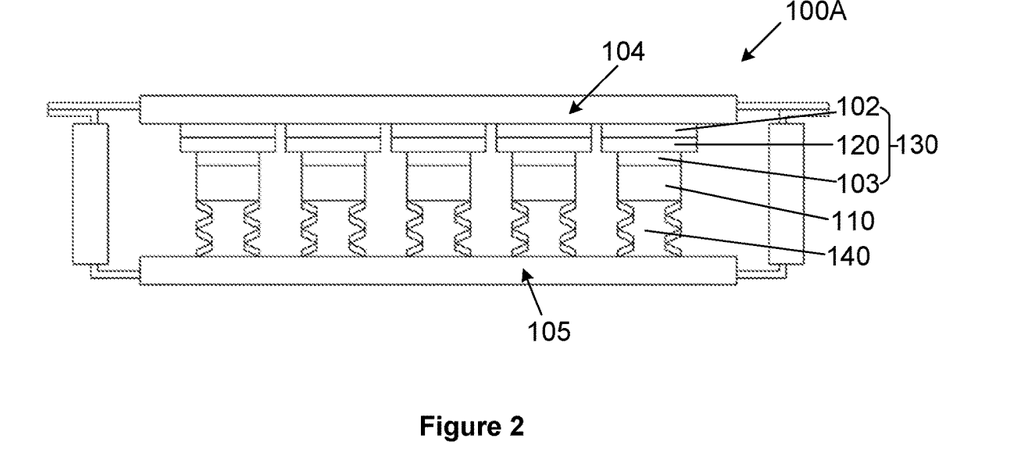
FIG. 2 schematically illustrates a sectional view of another prior semiconductor device.

With reference to FIG. 2, it is known from EP1393373A1 and WO2017/220949A1 that an array of spring assemblies 140 may be used as a means of applying pressure to the semiconductor units 130. The spring assemblies 140 typically have a maximum stroke of 1 mm or more, whereas the thickness variations of the semiconductor units 130 as well as the displacement of the electrodes 104, 105 are typically in the order of tens of microns. Therefore, the spring assemblies 140 maintain a high degree of pressure uniformity on the semiconductor chips 120. However, the spring assemblies 140 have poor thermal conductivity, which leads to significant thermal decoupling between the chips 120 and worsens the temperature imbalance across the chips 120.

It is an object of the present disclosure, among others, to provide an improved semiconductor device, which solves problems associated with known semiconductor devices, whether identified herein or otherwise.

SUMMARY

According to a first aspect of the present disclosure, there is provided a semiconductor device, comprising:
- a housing comprising a first housing electrode and a second housing electrode which are arranged at opposite sides of the housing, wherein the first housing electrode comprises an electrode plate;
- a plurality of semiconductor units arranged within the housing between the first and second housing electrodes and coupled to at least one of the first and second housing electrodes by pressure;
- a thermal coupler arranged within the housing between the plurality of semiconductor units and the electrode plate of the first housing electrode;
- a first array of pillars extending between the plurality of semiconductor units and the thermal coupler, and electrically coupled to the plurality of semiconductor units, respectively; and
- a second array of pillars extending between the thermal coupler and the electrode plate of the first housing electrode, wherein the first array of pillars are electrically coupled to the electrode plate via the second arrays of pillars;
- wherein the thermal coupler is configured to extend between at least some of the first array of pillars so as to thermally couple the at least some of the first array of pillars to one another.

By providing "a first array of pillars extending between the plurality of semiconductor units and the thermal coupler" and "a second array of pillars extending between the thermal coupler and the electrode plate of the first housing electrode", the first array of pillars are stacked on top of the second array of pillars between the plurality of semiconductor units and the electrode plate. As a result, the first and second arrays of pillars collectively provide tall pillars (the height of which is equivalent to a sum of the height of the first array of pillars and the height of the second array of pillars) between the plurality of semiconductor units and the electrode plate. Advantageously, the tall pillars have increased mechanical compliance than the first or second array of pillars alone. Therefore, the tall pillars are able to deform (e.g., bend) more easily in response to factors causing the pressure imbalance across the semiconductor units, thereby improving the uniform distribution of contact pressure across the semiconductor units.

By further providing a thermal coupler which is "configured to extend between at least some of the first array of pillars so as to thermally couple the at least some of the first array of pillars to one another", the thermal coupler improves thermal cross-coupling between the semiconductor units and reduces the temperature imbalance across the semiconductor units.

Therefore, the semiconductor device advantageously reduces the temperature imbalance across the semiconductor units within the device while improving the uniform distribution of contact pressure across the semiconductor units.

It would be understood that the first/second array of pillars may be laterally spaced to one another, and may be a one-dimensional array or a two-dimensional array.

By the expression "a plurality of semiconductor units . . . coupled to at least one of the first and second housing electrodes by pressure", it is meant that at least one of the first housing electrode and the second housing electrode forms a pressure contact with the plurality of semiconductor units. In other words, one or each of the interface between the semiconductor units and the first housing electrode and the interface between the semiconductor units and the second housing electrode comprises at least one dry interface.

The plurality of semiconductor units may be electrically and thermally coupled to one or more of the first and second housing electrodes. It would be understood that the plurality of semiconductor units comprise at least two semiconductor units.

The first array of pillars may be electrically and thermally coupled to the plurality of semiconductor units, respectively.

The first array of pillars may be electrically and thermally coupled to the electrode plate via the second arrays of pillars.

At least one of the first array of pillars may extend along a first direction between the plurality of semiconductor units and the electrode plate.

The first array of pillars and the second array of pillars may have a total length of L1 along the first direction. At least one of the plurality of semiconductor units may have a thickness of L2 along the first direction. L1 may be equal to or more than approximately 2.5 times L2.

By making L1 to be equal to or more than 2.5 times L2, the pillars collectively formed by the first and second arrays of pillars are relatively tall as compared to the thickness of the semiconductor units, and thus are useful for achieving optimum pressure distribution across the plurality of semiconductor units.

The thermal coupler may extend along a first plane which is perpendicular to the first direction.

The electrode plate of the first housing electrode may extend along a second plane, which is parallel to the first plane.

The thermal coupler may have a thickness of at least about 2 millimetres (mm) along the first direction.

Advantageously, the thickness of at least about 2 mm allows the thermal coupler to provide the desired thermal cross-coupling among the semiconductor units. In addition, the thickness of at least about 2 mm allows the thermal coupler to have sufficient stiffness, and enables the thermal coupler to be manufactured using typical mass production techniques (e.g., milling).

The thermal coupler may comprise a thermally conductive material.

The thermal coupler may comprise a thermally and electrically conductive material.

The thermal coupler may comprise a first surface facing the plurality of semiconductor units and a second surface opposite to the first surface and facing the electrode plate. The semiconductor device may further comprise a circuit board which is supported by the first surface of the thermal coupler.

The circuit board may comprise an electrical circuit for controlling an operation of one or more of the plurality of semiconductor units.

By arranging the circuit board to be supported by the first surface of the thermal coupler, short electrical connectors (which have a length approximately equal to a length of the first array of pillars along the first direction) may be used to electrically connect the plurality of semiconductor units to the circuit board. Short electrical connectors generally have better accuracy and efficiency than long electrical connectors.

The semiconductor device may further comprise electrical connectors which electrically connect the plurality of semiconductor units to the circuit board. The electrical connectors may comprise spring loaded pins.

The first plurality of pillars may be aligned with the second plurality of pillars.

By the expression "aligned with", it is meant that the locations of the first plurality of pillars and the locations of the second plurality of pillars are substantially coincident when viewed along a direction (e.g., the first direction described above) which is perpendicular to a surface of the first/second housing electrode.

The thermal coupler may be formed integrally with the first array of pillars.

The thermal coupler may be made of the same material (e.g., annealed copper) as the first array of pillars.

The second array of pillars may be formed integrally with the first array of pillars, respectively.

The second array of pillars may be coupled to the electrode plate by pressure.

The second array of pillars may be formed integrally with the electrode plate.

In other words, the first housing electrode may comprise the second plurality of pillars.

The second array of pillars may be coupled to the first array of pillars and/or the thermal coupler by pressure.

The thermal coupler may be further configured to extend between at least some of the second array of pillars so as to thermally couple the at least some of the second array of pillars to one another.

The thermal coupler may be integrally formed with the second array of pillars, or may be coupled to the second array of pillars by pressure.

The thermal coupler may be a first thermal coupler, and the semiconductor device may further comprise a second thermal coupler which is configured to extend between at least some of the second array of pillars so as to thermally couple the at least some of the second array of pillars to one another.

The second thermal coupler may have similar features and characteristics to the first thermal coupler. In particular, the second thermal coupler may be made of a thermally conductive material, and may extend along a third plane which is parallel to the first plane.

The second thermal coupler may be formed integrally with the second plurality of pillars. The second thermal coupler may be made of the same material as the second plurality of pillars.

The second thermal coupler may be arranged between the first thermal coupler and the second array of pillars. The second thermal coupler may be coupled to the first thermal coupler by pressure.

At least one of the semiconductor units may comprise a semiconductor chip.

At least one of the semiconductor units may further comprise first and second strain buffers arranged at opposite surfaces of the respective semiconductor chip.

The housing may further comprise an electrical insulator arranged between the first and second housing electrodes.

The housing may further comprise a first flange connecting the first housing electrode to the electrical insulator, and a second flange connecting the second housing electrode to the electrical insulator. The housing may be hermetic.

The semiconductor device may be a power semiconductor device. At least one of the plurality of semiconductor units may be a power semiconductor unit comprising a power semiconductor chip.

According to a second aspect of the present disclosure, there is provided a method of manufacturing a semiconductor device, the method comprising:
providing a housing, wherein the housing comprises a first housing electrode and a second housing electrode which are arranged at opposite sides of the housing, wherein the first housing electrode comprises an electrode plate;
arranging a plurality of semiconductor units within the housing between the first and second housing electrodes;
arranging a thermal coupler within the housing between the plurality of semiconductor units and the electrode plate of the first housing electrode;
providing a first array of pillars which extend between the plurality of semiconductor units and the thermal coupler and are electrically coupled to the plurality of semiconductor units, respectively;
providing a second array of pillars which extend between the thermal coupler and the electrode plate of the first housing electrode, wherein the first array of pillars are electrically coupled to the electrode plate via the second arrays of pillars; and
coupling at least one of the first and second housing electrodes to the plurality of semiconductor units by pressure;
wherein the thermal coupler is configured to extend between at least some of the first array of pillars so as to thermally couple the at least some of the first array of pillars to one another.

Where appropriate any of the optional features described above in relation to the first aspect of the present disclosure may be applied to the second aspect of the disclosure.

The expression "integrally formed" used in the present disclosure means that integrally formed elements are connected together so as to make up a single complete piece or unit, and so as to be incapable of being easily dismantled without destroying the integrity of the piece or unit.

The term "about" or "approximately" used in the present disclosure indicates a degree of variability (e.g., 20%) in the stated numerical values.

The terms "electrically coupled" and "thermally coupled" used in the present disclosure means that one or more intervening elements may be connected between the coupled elements.

It would also be understood that the terms "first", "second" and "third" are simply used in the present disclosure to label the relevant elements ("array of pillars", "housing electrodes", "direction", "plane" etc.) for the ease of description, and do not imply any limitations to the sequence or locations of the relevant elements.

BRIEF DESCRIPTION OF THE DRAWINGS

In order that the disclosure may be more fully understood, a number of embodiments of the disclosure will now be described, by way of example, with reference to the accompanying drawings, in which.

In the figures, like parts are denoted by like reference numerals.

It will be appreciated that the drawings are for illustration purposes only and are not drawn to scale.

DETAILED DESCRIPTION OF THE PREFERRED EMBODIMENTS

Figure 3:
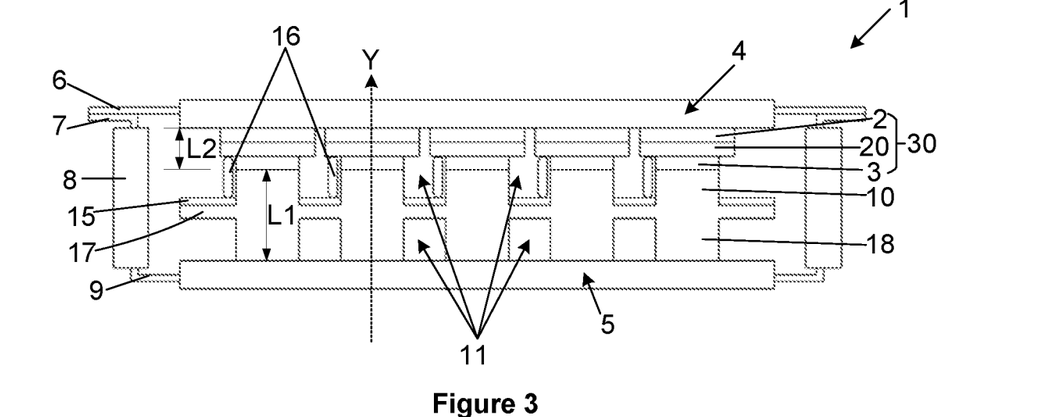
FIG. 3 schematically illustrates a sectional view of a semiconductor device according to a first embodiment of the present disclosure.

FIG. 3 schematically illustrates a cross sectional view of a semiconductor device 1 (referred to as the "device" below) according to a first embodiment of the present disclosure. In this example, the semiconductor device 1 is embodied as a multi-chip press-pack power semiconductor device.

As shown in FIG. 3, the device 1 comprises an upper electrode 4 and a lower electrode 5 arranged at opposite sides of the device 1. The upper electrode 4 and the lower electrode 5 may also be referred to as housing electrodes. The lower electrode 5 may be referred to as a "first housing electrode", and the upper electrode 4 may be referred to as a "second housing electrode". In the example of FIG. 3, each of the upper electrode 4 and the lower electrode 5 takes the form of an electrode plate which has generally flat inner and outer surfaces, with the inner surface facing the semiconductor units 30 and the outer surface exposed to an exterior of the device 1.

The device 1 further comprises upper strain buffers 2, lower strain buffers 3, and a plurality of power semiconductor chips 20 (referred to as the "chips" below). The upper strain buffers 2 and the lower strain buffers 3 are arranged at opposite surfaces of the chips 20. The upper and lower electrodes 4, 5 are typically made of copper. The upper strain buffers 3 and the lower strain buffers 4 are typically made of molybdenum. The power semiconductor chips 20 may be made in silicon technology, or alternatively may be based upon other types of semiconductors, such as, silicon carbide, gallium nitride, or silicon germanium etc. The chips 20 may comprise one or more of a power transistor (e.g., an IGBT, a power MOSFET, a power BJT), a power diode, and a power thyristor (e.g., an IGCT, a GTO) etc.

During normal operation of the device 1, the device 1 heats and cools, and consequently each component of the device 1 undergoes thermal expansion and contraction. Difference in the thermal expansion coefficients of adjacent components leads to abrasive wear (also called "fretting") of their contact surfaces. The thermal expansion coefficients of silicon and molybdenum are more closely matched than those of silicon and copper. The strain buffers 2, 3 are useful for reducing the rate of wear on the surfaces of the chips 20. The chips 20 may be silver sintered (or otherwise bonded) to the strain buffers 2, 3 to further reduce the risks of fretting and reduce the thermal resistance of the chips 20. A combination of a single chip 20 with its associated strain buffers 2, 3 may be referred to as a semiconductor unit 30. It would, however, be appreciated that the strain buffers 2, 3 may be wholly or partly omitted from the semiconductor units 30.

As shown by FIG. 3, the semiconductor units 30 are laterally spaced to one another, and are electrically connected in parallel between the upper electrode 4 and the lower electrode 5. Therefore, the overall current rating of the device 1 is generally determined by the number of semiconductor units 30 paralleled inside the device 1 and the current rating of each semiconductor unit 30.

The device 1 further includes a lid flange 6, a housing upper flange 7, an electrical insulator 8, and a housing lower flange 9. These components form a gas-tight (or hermetic) connection between the upper electrode 4 and the lower electrode 5. The lid flange 6 and the housing upper flange 7 connect the upper electrode 4 with the electrical insulator 8. The housing lower flange 9 connects the lower electrode 5 with the electrical insulator 8. The electrodes 4, 5, the flanges 6, 7, 9 as well as the electrical insulator 8 together form a hermetic housing of the device 1. The semiconductor units 30 are located within the housing between the upper and lower electrodes 4, 5. The housing encloses an internal space 11 which is typically filled with an inert gas (e.g., nitrogen) at a suitable pressure (e.g., approximately one standard atmospheric pressure) to ensure reliable operation of the chips 20. While FIG. 3 shows that the internal space 11 includes separate sections located at opposite sides of each semiconductor unit 30, it would be understood that the separate sections are in fact interconnected in the third dimension relative to the cross-sectional plane of FIG. 3.

The electrical insulator 8 electrically isolates the upper electrode 4 from the lower electrode 5. The electrical insulator 8 may have a tubular or cylindrical shape and comprises an electrically insulating material (e.g., ceramic). It would be appreciated that the electrical insulator 8 may comprise electrically conductive material(s) as far as the electrically conductive material(s) do not form a conducting path between the housing electrodes 4, 5. The electrical insulator 8 typically surrounds the semiconductor units 30. The flanges 6, 7, and 9 may be made of copper or nickel-iron.

Apart from the semiconductor units 30, the hermetic housing of the device 1 further houses a first array of pillars (referred to as "upper pillars" below) 10, a second array of pillars (referred to as "lower pillars" below) 18, a thermal coupler 17, a circuit board 15 and electrical connectors 16.

As shown in FIG. 3, the upper pillars 10 are laterally spaced and parallel to one another, and the lower pillars 18 are also laterally spaced and parallel to one another. Each of the upper and lower pillars 10, 18 extend along a vertical Y direction which is generally perpendicular to the surfaces of the housing electrodes 4, 5. The thermal coupler 17 is arranged between the semiconductor units 30 and the lower electrode 5. The upper pillars 10 extend between the thermal coupler 17 and respective ones of the semiconductor units 30. The lower pillars 18 extend between the thermal coupler 17 and the lower electrode 5. In other words, the upper pillars 10 are stacked on top of respective ones of the lower pillars 18, which are further supported by the lower electrode 5. In the example of FIG. 3, the upper pillars 10 are aligned with the lower pillars 18, such that the locations of the upper pillars 10 and the locations of the lower pillars 18 are substantially coincident when viewed along the vertical Y direction. Further, the upper pillars 10 are integrally formed with the lower pillars 18. In this way, the upper and lower pillars 10, 18 may be considered as upper sections and lower sections of an array of tall pillars extending between the lower electrode 5 and respective ones of the semiconductor units 30, and each of the tall pillars has an identical cross-sectional size along the Y direction.

Figure 4:
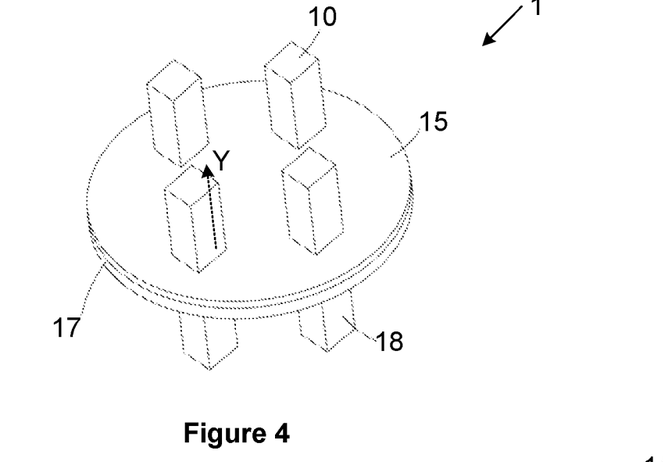
FIG. 4 schematically illustrates a partial perspective view of the semiconductor device of FIG. 3.

FIG. 4 illustrates, from a perspective viewpoint, part of the thermal coupler 17, the circuit board 15, the upper pillars 10 and the lower pillars 18. In this example, the thermal coupler 17 is of a circular disk shape and generally extends along a first plane which is perpendicular to the Y direction. The lower electrode 5 and/or the upper electrode 4 extend along a second plane which is parallel to the first plane. The thermal coupler 17 comprises a thermally conductive material, and extends between the array of tall pillars collectively formed by the corresponding upper and lower pillars 10, 18. Therefore, the thermal coupler 17 thermally couples the array of tall pillars to one another. It would be appreciated that the thermal coupler 17 may comprise other material(s) in addition to the thermally conductive material. The thermal coupler 17 is described below in more detail.

While FIG. 4 shows that the upper pillars 10 form a two-dimensional array of pillars, it would be understood that the upper pillars 10 may alternatively form a one-dimensional array of pillars. The same applies to the lower pillars 10. In addition, it would be appreciated that the upper pillars 10 may not be strictly aligned with the lower pillars 18.

The circuit board 15 may comprise a printed circuit board (PCB) and at least one electrical circuit mounted on the PCB for controlling the operation of the chips 20. The PCB may comprise holes with sizes equal to or slightly greater than the cross-sectional dimensions of the upper pillars 10. Therefore, the circuit board 15 may be mounted onto the top surface of the thermal coupler 17 by passing the upper pillars 10 through the holes of the PCB. Electrical connectors 16 are used to electrically connect the circuit(s) on the circuit board 15 to electrode pads of the chips 20. For example, if the chips 20 are IGBTs, the circuit board 15 may comprise a driver circuit which generates a gate-emitter voltage, and the electrical connectors 16 may connect the gate pad of each chip 20 to an output pad on the circuit board 15. It would be appreciated that the circuit board 15 and the electrical connectors 16 may be omitted for certain types of chips 20 (e.g., power diodes).

The electrical connectors 16 may take the form of spring loaded pins (e.g., pogo pins). A typical spring-loaded pin may comprise three main parts—a plunger, barrel, and spring. When force is applied to the pin, the spring is compressed and the plunger moves inside the barrel. The compressed spring in the pin in turn applies a force against the plunger, counteracting any unwanted movement which might otherwise cause an intermittent connection. The shape of the barrel retains the plunger, stopping the spring from pushing it out when the pin is not locked in place. Spring loaded pins typically have improved durability over other electrical contacts, and the electrical connections created by spring loaded pins generally show great resilience to mechanical shock and vibration.

With further reference to FIG. 3, the upper pillars 10 form contacts with the lower strain buffers 3 of the semiconductor units 30. The semiconductor units 30 have upper and lower contact regions of differing areas. The upper pillars 10 permit contact to the smaller areas at the bottom surfaces of the semiconductor units 30. At least one of the upper and lower electrodes 4, 5 forms a pressure contact with the semiconductor units 30. The remaining one (if any) of the upper and lower electrodes 4, 5 may be fixedly bonded to the semiconductor units 30, by for example using a bonding material. "Pressure contact" means that at least one of the upper and lower electrodes 4, 5 is coupled to the semiconductor units 30 by pressure. In the event that there are multiple interfaces between the semiconductor units 30 and a housing electrode (e.g., the lower electrode 5), "pressure contact" means that there is at least one dry interface between the semiconductor units 30 and that housing electrode. A dry interface means that elements at opposite sides of the interface are coupled by pressure, and there is no bonding material between the elements. For example, a dry interface may exist between the semiconductor units 30 and the upper electrode 4, causing the upper electrode 4 to form a pressure contact with the semiconductor units 30. Further or alternatively, a dry interface may exist between the semiconductor units 30 and the upper pillars 10, and/or between the lower pillars 18 and the lower electrode 5, thus causing the lower electrode 5 to form a pressure contact with the semiconductor units 30. By clamping the semiconductor units 30 as well as the pillars 10, 18 between the housing electrodes 4, 5, an electrical and thermal conducting path is established between the housing electrodes 4, 5 through the chips 20. In particular, upper surfaces of the chips 20 are electrically and thermally coupled to the upper electrode 4. Lower surfaces of the chips 20 are electrically and thermally coupled to the lower electrode 5 via the upper and lower pillars 10, 18. The upper and lower pillars 10, 18 therefore collectively provide electrical and thermal conductor paths between respective ones of the semiconductor units 30 and the lower electrode 5.

As shown in FIG. 3, the tall pillars collectively formed by the upper and lower pillars 10, 18 have a length L1 along the Y direction. The length L1 is a combined length of the upper pillars 10 and the lower pillars 18 along the Y direction. The term "length" may be used interchangeable with "height" in the present disclosure. Each semiconductor unit 30 has a thickness L2 along the Y direction. L1 is relatively tall as compared to L2. Preferably, L1 is at least 2.5 times L2. More preferably, L1 may be at least 3 times L2. The particular value of L1 may be determined through experimentation. For example, if the total height of the device 1 is a nominal value of 26.5 mm, L2 may be up to 4 mm and L1 may be in the region of 10-15 mm. L1 is greater than the height of the pillars 110 (which may be similar to the height of the upper pillars 10) used in the prior device 100. However, by reducing the thicknesses of the housing electrodes 4, 5 as compared to the housing electrodes 104, 105, the device 1 may have the same height as the prior device 100 along the vertical Y direction.

By making L1 to be relatively tall as compared to L2 (e.g., at least 2.5 times L2), the tall pillars collectively formed by the upper and lower pillars 10, 18 have a great aspect ratio (or slenderness ratio), which in turn causes the tall pillars to have decreased stiffness and increased mechanical compliance. Therefore, the tall pillars are able to deform (e.g., bend) more easily than the upper pillars 10 or the lower pillars 18 alone (or the pillars 110 of FIG. 1), in response to factors described above (e.g., surface flatness variations, self-heating effect etc.) which cause the pressure imbalance across the chips 20. Consequently, by stacking the upper and lower pillars 10, 18 to produce tall pillars between the semiconductor units 30 and the lower electrode 5, the pressure imbalance across the chips 20 can be reduced, and a high degree of pressure uniformity may be maintained across the semiconductor chips 20. As described above, pressure uniformity ensures that electrical and thermal contact resistances between the chips 20 and the housing electrodes 4, 5 are maintain at uniform levels across the chips 20, and accordingly improves the reliability of the device 1.

However, the tall pillars collectively formed by the upper and lower pillars 10, 18 have the effect of thermally decoupling the chips 20 from one another, allowing them to assume different temperatures. The thermal decoupling effect increases with the pillar height, so in this respect pressure uniformity and temperature uniformity are negatively correlated. It is desirable to retain the thermal cross-coupling that is achievable with short pillars, whilst achieving the benefits of pressure uniformity that tall pillars give.

The thermal coupler 17 advantageously mitigates the thermal decoupling effect caused by the tall pillars. Without the thermal coupler 17, the array of tall pillars collectively formed by the corresponding upper and lower pillars 10, 18 would be isolated from one another, apart from at the lower ends where each of the tall pillars contacts the lower electrode 5. The physical isolation between the tall pillars causes the thermal decoupling of the chips 20. With reference to FIGS. 3 and 4, the thermal coupler 17 extends between lower ends of the upper pillars 10 so as to thermally couple the upper pillars 10 to one another. The thermal coupler 17 also extends between upper ends of the lower pillars 10 so as to thermally couple the lower pillars 10 to one another. In this way, the thermal coupler 17 effectively reduces the differences in chip temperatures within the device 1, and accordingly improves the performance and reliability of the device 1. Indeed, due to the thermal coupler 17, the thermal cross-coupling between the chips 20 within the device 1 is on a similar scale to that in the device 100 of FIG. 1 if the height of the pillars 110 is similar to the height of the upper pillars 10.

Therefore, by having the upper pillars 10, the lower pillars 18 and the thermal coupler 17, the device 1 achieves improved pressure uniformity across the chips 20 due to the increased mechanical compliance provided by the upper and lower pillars 10, 18, and also achieves improved thermal uniformity across the chips 20 due to the thermal cross-coupling effect provided by the thermal coupler 17.

In the example of FIG. 3, the thermal coupler 17 is integrally formed with the upper and lower pillars 10, 18. Therefore, the thermal coupler 17 as well as the upper and lower pillars 10, 18 are made of the same material (e.g., annealed copper) which is electrically and thermally conductive. The combined structure of the pillars 10, 18 and the thermal coupler 17 may be formed by applying a milling process to opposite surfaces of a block of annealed copper.

Alternatively, it would be understood that the thermal coupler 17 may be separately provided, and may be secured to the tall pillars collectively formed by the upper and lower pillars 10, 18 in any suitable manner which allows the thermal coupler 17 to be thermally coupled to the tall pillars. In that case, the thermal coupler 17 may be made of a different material than the pillars 10, 18.

The thickness of the thermal coupler 17 is generally determined by consideration of the desired thermal cross-coupling between adjacent chips 20 and also the requirements for sufficient stiffness to allow accurate manufacturing using typical mass production techniques, such as milling. In the event that the thermal coupler 17 is made of annealed copper, a thicknesses in excess of approximately 2 mm are desirable.

FIGS. 3 and 4 show that the thermal coupler 17 extends continuously between adjacent pillars and has a periphery which surrounds all of the pillars within the device 1. This arrangement is beneficial for maximising the thermal coupling between the pillars, but may be modified based upon specific requirements of the device 1. For example, it would be understood that the thermal coupler 17 may comprise holes extending through the thermal coupler 17 so as to allow additional elements to pass through itself, and that the thermal coupler 17 may extend between some but not all of the pillars contained within the device 1.

The thermal coupler 17 provides additional benefits in that it acts as a base layer to support the circuit board 15. In particular, as shown in FIG. 3, the thermal coupler 17 has an upper surface that faces the semiconductor units 30 and an opposing lower surface that faces the lower electrode 5. The circuit board 15 is held against the upper surface of the thermal coupler 17. This is contrast to the know device 100 in which the circuit board 105 is supported by the electrode plate 119 of the lower electrode 105. Using the thermal coupler 17 to support the circuit board 15 allows the use of shorter electrical connectors 16 as compared to the arrangement of using the lower electrode 5 to support the circuit board 15. Accuracy of electrical connectors 16 (e.g., spring loaded pins) at very long lengths is generally unacceptable, so additional guide components would required to guide the long electrical connectors 16, thus leading to additional material usage. In contrast, short electrical connectors 16 achieve good accuracy without requiring any additional guide component.

As described above, the tall pillars collectively formed by the upper and lower pillars 10, 18 have a length L1 along the Y direction. The length of the upper pillars 10 may be determined through consideration of the working length of the electrical connectors 16, the thickness of the lower strain buffer 3, and the thickness of the circuit board 15. In an example, the length of the upper pillars 10 may be as little as 3 mm. The length of the lower pillars 18 is defined as the difference between the total length L1 and the length of the upper pillars 10.

Figure 5:
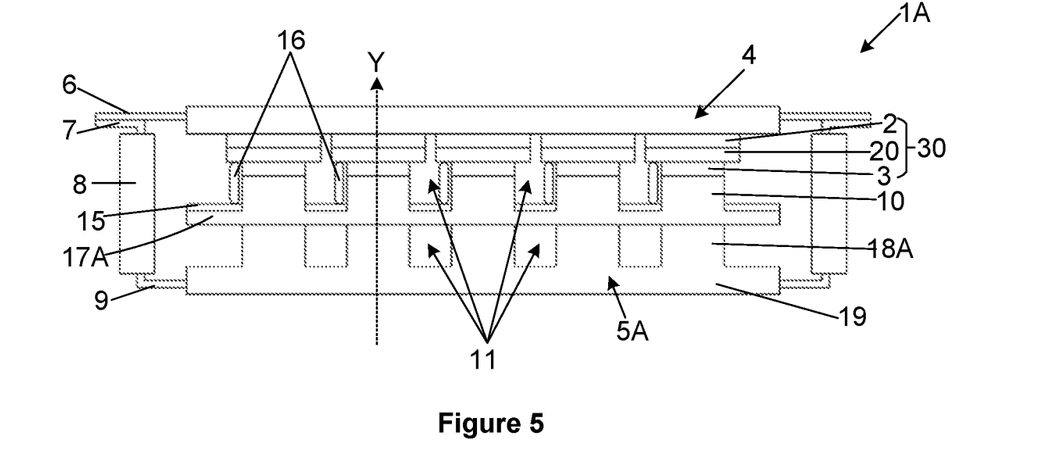
FIG. 5 schematically illustrates a sectional view of a semiconductor device according to a second embodiment of the present disclosure.

FIG. 5 illustrates a sectional view of a semiconductor device 1A according to a second embodiment of the present disclosure. Elements of the device 1A that are identical to those of the device 1 are identified using the same labels. Elements of the device 1A that correspond to, but are different from those of the device 1 are labelled using the same numerals but with a letter 'A' for differentiation. The features and advantages described above with reference to the first embodiment are generally applicable to the second embodiment.

The device 1A differs from the device 1 in that within the device 1A, the lower pillars 18A are integrally formed with the electrode plate 19 of the lower electrode 5A. In other words, the lower electrode 5A comprises the electrode plate 19 and the lower pillars 18A which extend from an inner surface of the electrode plate 19 into the internal space 11 of the device 1A. The upper pillars 10 are integrally formed with the thermal coupler 17A. The thermal coupler 17A extends between at least some of the upper pillars 10 and thermally couple the upper pillars 10 so as to reduce the temperature differences of the chips 20. A dry interface may exist between a lower surface of the thermal coupler 17A and upper surfaces of the lower pillars 18A. Once the device 1A is assembled, it is expected that the thermal coupler 17A also thermally couple the lower pillars 18. The thermal coupler 17A is identical to the thermal coupler 17 in other aspects.

Figure 6:
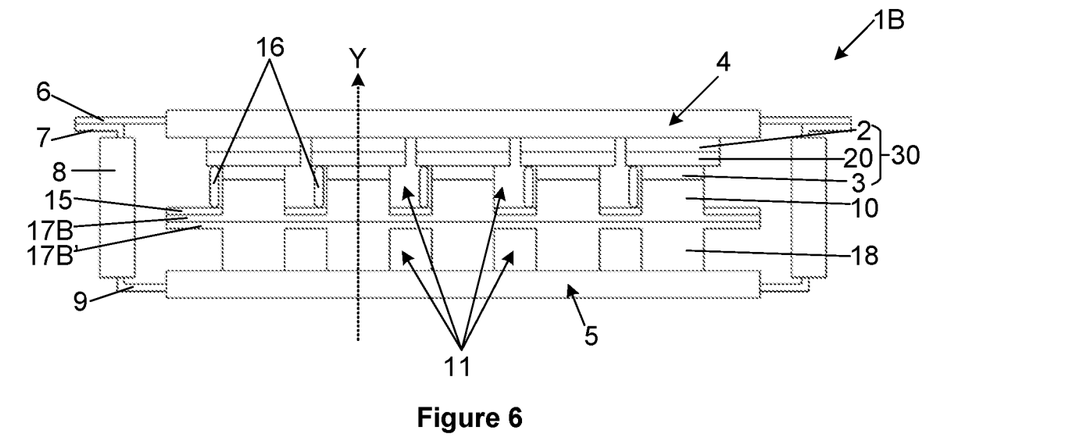
FIG. 6 schematically illustrates a sectional view of a semiconductor device according to a third embodiment of the present disclosure.

FIG. 6 illustrates a sectional view of a semiconductor device 1B according to a third embodiment of the present disclosure. Elements of the device 1B that are identical to those of the device 1 are identified using the same labels. Elements of the device 1B that correspond to, but are different from those of the device 1 are labelled using the same numerals but with a letter 'B' for differentiation. The features and advantages described above with reference to the first embodiment are generally applicable to the third embodiment.

The device 1B differs from the device 1 in that the device 1B comprises a first thermal coupler 17B and a second thermal coupler 17B'. The first thermal coupler 17B is formed integrally with the upper pillars 10. The first thermal coupler 17B extends between at least some of the upper pillars 10 and thermally couple the upper pillars 10 so as to reduce the temperature differences of the chips 20. The second thermal coupler 17B' is formed integrally with the lower pillars 18. The second thermal coupler 17B' extends between at least some of the lower pillars 18 and thermally couple the lower pillars 18. Each of the first thermal coupler 17B and the second thermal coupler 17B' extend along a plane which is perpendicular to the vertical Y direction.

The first thermal coupler 17B has an upper surface which supports the circuit board 15 and an opposing lower surface which faces the lower electrode 5. Similarly, the second thermal coupler 17B' has an upper surface which faces the semiconductor units 30 and an opposing lower surface which faces the lower electrode 5. A dry interface may exist between the lower surface of the first thermal coupler 17B and the upper surface of the second thermal coupler 17B'. Once the device 1B is assembled, it is expected that the combination of the first thermal coupler 17B and the second thermal coupler 17B' function in a way similar to the thermal coupler 17 of the device 1.

The examples illustrated by FIGS. 3, 5 and 6 show that the upper and lower pillars 10, 18 as well as the thermal coupler 17, 17A, or 17B&17B' are provided between the semiconductor units 30 and the lower electrode 5, and that no pillars are provided between the semiconductor units 30 and the upper electrode 4. It would be appreciated that the upper and lower pillars as well as the thermal coupler may alternatively be provided between the semiconductor units 30 and the upper electrode 4. It would further be appreciated that at least one array of pillars may be arranged between each of the housing electrodes 4, 5 and the semiconductor units 30.

FIGS. 3, 5 and 6 show that each of the devices 1, 1A, 1B comprises five semiconductor units 30. It would be appreciated that this is purely for conceptual clarity, and that the device may comprise any suitable number (e.g., at least two) of semiconductor units 30. For example, the number of semiconductor units 30 may be chosen based upon the desired overall current rating of the device.

While FIGS. 3, 5 and 6 relate to multi-chip press-pack power semiconductor devices, it would be appreciated that the upper and lower pillars 10, 18 as well as the thermal coupler 17, 17A, or 17B&17B' may be similarly used in any pressure-contact semiconductor device.

Figure 7:
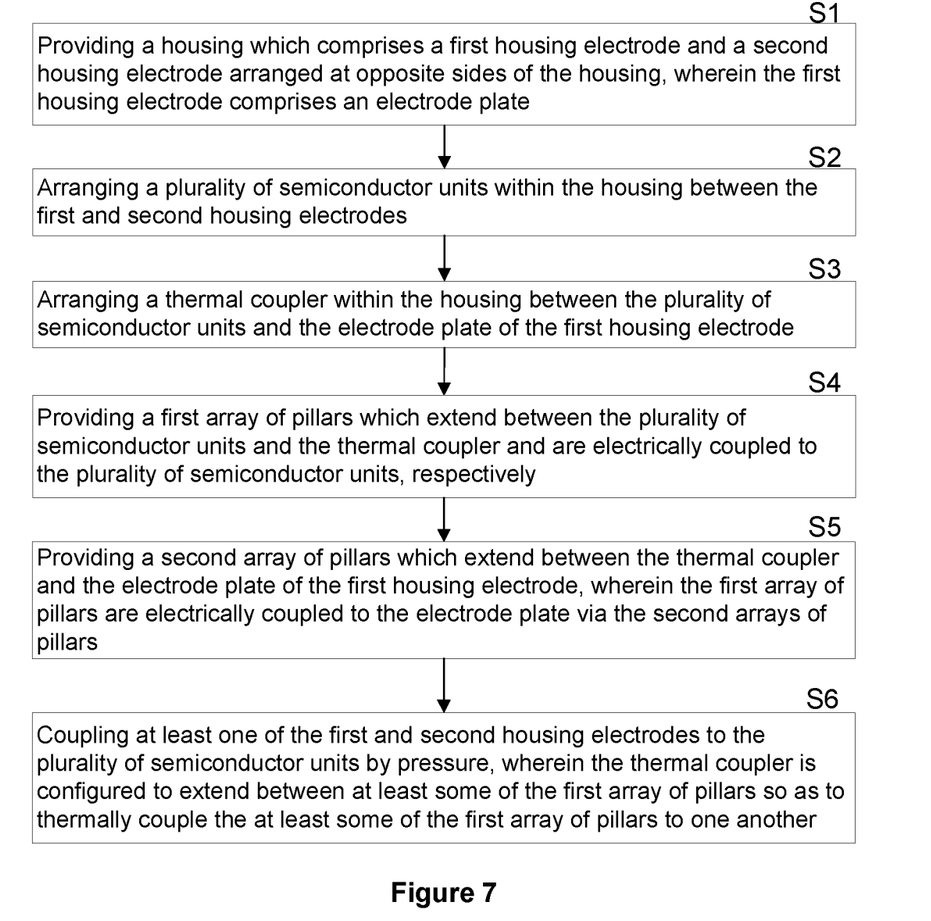
FIG. 7 shows process steps of a method for manufacturing a semiconductor device.

FIG. 7 schematically illustrates processing steps of a method for manufacturing a semiconductor device (e.g., the device 1, 1A or 1B).

At step S1, a housing is provided. The housing comprises a first housing electrode (e.g., the lower electrode 5, 5A) and a second housing electrode (e.g., the upper electrode 4) arranged at opposite sides of the housing. The first housing electrode comprises an electrode plate (e.g., the electrode plate 19).

At step S2, a plurality of semiconductor units (e.g., the semiconductor units 30) are arranged within the housing between the first and second housing electrodes. The plurality of semiconductor units may be laterally spaced to one another.

At step S3, a thermal coupler (e.g., the thermal coupler 17, 17A, or 17B&17B') is arranged within the housing between the plurality of semiconductor units and the electrode plate of the first housing electrode.

At step S4, a first array of pillars (e.g., the upper pillars 10) are provided. The first array of pillars extend between the plurality of semiconductor units (e.g., the semiconductor units 30) and the thermal coupler (e.g., the thermal coupler 17, 17A, or 17B&17B'). The first array of pillars are also electrically coupled to the plurality of semiconductor units.

At step S5, a second array of pillars (e.g., the lower pillars 18, 18A) are provided. The second array of pillars extend between the thermal coupler (e.g., the thermal coupler 17, 17A, or 17B&17B') and the electrode plate of the first housing electrode (e.g., the lower electrode 5, 5A). The first array of pillars (e.g., the upper pillars 10) are electrically coupled to the electrode plate via the second array of pillars (e.g., the lower pillars 18, 18A).

At step S6, at least one of the first and second housing electrodes is coupled to the plurality of semiconductor units by pressure. This means that a pressure contact is formed between the plurality of semiconductor units and at least one of the first and second housing electrodes. The thermal coupler is configured to extend between at least some of the first array of pillars so as to thermally couple the at least some of the first array of pillars to one another.

It would be appreciated that the steps may be performed in a temporal order that is different from the order of description. For example, step S1 may comprise two sub-steps, which provide a first part and a second part of the housing, respectively, and steps S2 to S6 may be performed between the two sub-steps. In a further example, at least two of steps S3 to S5 may be performed simultaneously, depending upon whether the thermal coupler is integrally formed with the first/second array of pillars. In another example, step S2 may be performed after steps S3 to S5, depending upon the particular structures of the semiconductor device.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The skilled person will understand that in the preceding description and appended claims, positional terms such as 'upper', 'lower', 'top', 'bottom', 'lateral', 'vertical' etc. are made with reference to conceptual illustrations of a semiconductor device, such as those showing standard layout plan views and those shown in the appended drawings. These terms are used for ease of reference but are not intended to be of limiting nature. These terms are therefore to be understood as referring to a semiconductor device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A semiconductor device, comprising:
   a housing comprising a first housing electrode and a second housing electrode which are arranged at opposite sides of the housing, wherein the first housing electrode comprises an electrode plate;
   a plurality of semiconductor units arranged within the housing between the first and second housing electrodes and coupled to at least one of the first and second housing electrodes by pressure;
   a thermal coupler arranged within the housing between the plurality of semiconductor units and the electrode plate of the first housing electrode, wherein the thermal coupler comprises a first surface facing the plurality of semiconductor units and a second surface opposite to the first surface and facing the electrode plate;
   a first array of pillars extending between the plurality of semiconductor units and the thermal coupler, and electrically coupled to the plurality of semiconductor units respectively;
   a second array of pillars extending between the thermal coupler and the electrode plate of the first housing electrode, wherein the first array of pillars are electrically coupled to the electrode plate via the second arrays of pillars;
   a circuit board which is supported directly by the first surface of the thermal coupler, and
   electrical connectors which electrically connect the plurality of semiconductor units to the circuit board,
   wherein the thermal coupler is configured to extend between at least some of the first array of pillars so as to thermally couple the at least some of the first array of pillars to one another.

2. A semiconductor device according to claim 1, wherein at least one of the first array of pillars extends along a first direction between the plurality of semiconductor units and the electrode plate.

3. A semiconductor device according to claim 2, wherein the thermal coupler extends along a first plane which is perpendicular to the first direction.

4. A semiconductor device according to claim 2, wherein the thermal coupler has a thickness of at least about 2 millimetres along the first direction.

5. A semiconductor device according to claim 2, wherein the first array of pillars and the second array of pillars have a total length of L1 along the first direction, and at least one of the plurality of semiconductor units has a thickness of L2 along the first direction, and wherein L1 is equal to or more than approximately 2.5 times L2.

6. A semiconductor device according to claim 1, wherein the thermal coupler comprises a thermally conductive material.

7. A semiconductor device according to claim 1, wherein the electrical connectors comprise spring loaded pins.

8. A semiconductor device according to claim 1, wherein the first plurality of pillars are aligned with the second plurality of pillars.

9. A semiconductor device according to claim 1, wherein the thermal coupler is formed integrally with the first array of pillars.

10. A semiconductor device according to claim 1, wherein the second array of pillars are formed integrally with the electrode plate.

11. A semiconductor device according to claim 1, wherein the thermal coupler is further configured to extend between at least some of the second array of pillars so as to thermally couple the at least some of the second array of pillars to one another.

12. A semiconductor device according to claim 1, wherein the thermal coupler is a first thermal coupler, and wherein the semiconductor device further comprises a second thermal coupler which is configured to extend between at least some of the second array of pillars so as to thermally couple the at least some of the second array of pillars to one another.

13. A semiconductor device according to claim 12, wherein the second thermal coupler is formed integrally with the second plurality of pillars.

14. A semiconductor device according to claim 12, wherein the second thermal coupler is arranged between the first thermal coupler and the second array of pillars.

15. A semiconductor device according to claim 1, wherein at least one of the semiconductor units comprises a semiconductor chip.

16. A semiconductor device according to claim 15, wherein at least one of the semiconductor units further comprises first and second strain buffers arranged at opposite surfaces of the respective semiconductor chip.

17. A semiconductor device comprising:
   a housing comprising a first housing electrode and a second housing electrode which are arranged at opposite sides of the housing, wherein the first housing electrode comprises an electrode plate;
   a plurality of semiconductor units arranged within the housing between the first and second housing electrodes and coupled to at least one of the first and second housing electrodes by pressure;
   a thermal coupler arranged within the housing between the plurality of semiconductor units and the electrode plate of the first housing electrode;
   a first array of pillars extending between the plurality of semiconductor units and the thermal coupler, and electrically coupled to the plurality of semiconductor units respectively;
   a second array of pillars extending between the thermal coupler and the electrode plate of the first housing electrode,
   wherein the first array of pillars are electrically coupled to the electrode plate via the second arrays of pillars, and
   wherein the second array of pillars are formed integrally with the first array of pillars respectively.

18. A method of manufacturing a semiconductor device, comprising:
   providing a housing, wherein the housing comprises a first housing electrode and a second housing electrode which are arranged at opposite sides of the housing, wherein the first housing electrode comprises an electrode plate;
   arranging a plurality of semiconductor units within the housing between the first and second housing electrodes;
   arranging a thermal coupler within the housing between the plurality of semiconductor units and the electrode plate of the first housing electrode, wherein the thermal coupler comprises a first surface facing the plurality of semiconductor units and a second surface opposite to the first surface and facing the electrode plate;
   providing a first array of pillars which extend between the plurality of semiconductor units and the thermal coupler and are electrically coupled to the plurality of semiconductor units respectively;
   providing a second array of pillars which extend between the thermal coupler and the electrode plate of the first housing electrode, wherein the first array of pillars are electrically coupled to the electrode plate via the second arrays of pillars;

supporting a circuit board directly by the first surface of the thermal coupler;

electrically connecting the plurality of semiconductor units to the circuit board using electrical connectors; and coupling at least one of the first and second housing electrodes to the plurality of semiconductor units by pressure, wherein the thermal coupler is configured to extend between at least some of the first array of pillars so as to thermally couple the at least some of the first array of pillars to one another.

* * * * *